(12) United States Patent
Kamp

(10) Patent No.: US 7,851,369 B2
(45) Date of Patent: Dec. 14, 2010

(54) HARDMASK TRIM METHOD

(75) Inventor: Tom A. Kamp, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 456 days.

(21) Appl. No.: 11/448,246

(22) Filed: Jun. 5, 2006

(65) Prior Publication Data

US 2007/0281491 A1    Dec. 6, 2007

(51) Int. Cl.
*H01L 21/461*    (2006.01)
*H01L 21/302*    (2006.01)

(52) U.S. Cl. ........................................ 438/717

(58) Field of Classification Search ............ 438/717, 438/719, 694
See application file for complete search history.

(56) References Cited

U.S. PATENT DOCUMENTS

| | | | |
|---|---|---|---|
| 4,654,112 A | 3/1987 | Douglas et al. | |
| 6,368,982 B1 * | 4/2002 | Yu | ............................ 438/753 |
| 2003/0224606 A1 | 12/2003 | Laaksonen et al. | |
| 2005/0205862 A1 | 9/2005 | Koemtzopoulos et al. | |

FOREIGN PATENT DOCUMENTS

WO    WO 97/17725    5/1997

OTHER PUBLICATIONS

International Search Report dated Dec. 13, 2007 from corresponding International Application No. PCT/US2007/070270.
Written Opinion dated Dec. 13, 2007 from corresponding International Application No. PCT/US2007/070270.
Office Action dated Jan. 8, 2010 from Chinese Patent Application No. 200780020952.8

* cited by examiner

*Primary Examiner*—Alexander G Ghyka
(74) *Attorney, Agent, or Firm*—Beyer Law Group LLP

(57) ABSTRACT

A method for forming features in a polysilicon layer is provided. A hardmask layer is formed over the polysilicon layer. A photoresist mask is formed over the hardmask layer. The hardmask layer is etched through the photoresist mask to form a patterned hardmask. The patterned hardmask is trimmed by providing a non-carbon containing trim gas comprising oxygen and a fluorine containing compound, forming a plasma from the trim gas, and trimming the hardmask. Features are etched into the polysilicon layer through the hardmask.

10 Claims, 6 Drawing Sheets

HARDMASK TRIM METHOD

BACKGROUND OF THE INVENTION

The present invention relates to the formation of semiconductor devices. More particularly, the invention relates etching features into a polysilicon layer during the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

SUMMARY OF THE INVENTION

To achieve the foregoing and in accordance with the purpose of the present invention a method for forming features in a polysilicon layer is provided. A hardmask layer is formed over the polysilicon layer. A photoresist mask is formed over the hardmask layer. The hardmask layer is etched through the photoresist mask to form a patterned hardmask. The patterned hardmask is trimmed by providing a non-carbon containing trim gas comprising oxygen and a fluorine containing compound, forming a plasma from the trim gas, and trimming the hardmask. Features are etched into the polysilicon layer through the hardmask.

In another manifestation of the invention, a method for trimming a hardmask over a polysilicon layer is provided. A carbon free trim gas comprising oxygen and a fluorine containing compound is provided. A plasma is formed from the trim gas. The hardmask is trimmed.

In another manifestation of the invention an apparatus for forming features in an etch layer disposed under a hardmask layer disposed under a photoresist mask is provided. A plasma processing chamber comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source in fluid connection with the gas inlet comprising an oxygen gas source, a fluorine containing compound gas source, and a polysilicon etch gas source. A controller controllably connected to the gas source and the at least one electrode. The controller comprises at least one processor and computer readable media, comprising computer readable code for etching the hardmask layer through the photoresist mask to form a patterned hardmask, computer readable code for trimming the patterned hardmask, comprising computer readable code for providing a non-carbon containing trim gas comprising oxygen and a fluorine containing compound from the gas source through the gas inlet into the plasma processing chamber, computer readable code for forming a plasma from the trim gas, and computer readable code for trimming the hardmask, and computer readable coded for etching features into the polysilicon layer through the hardmask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
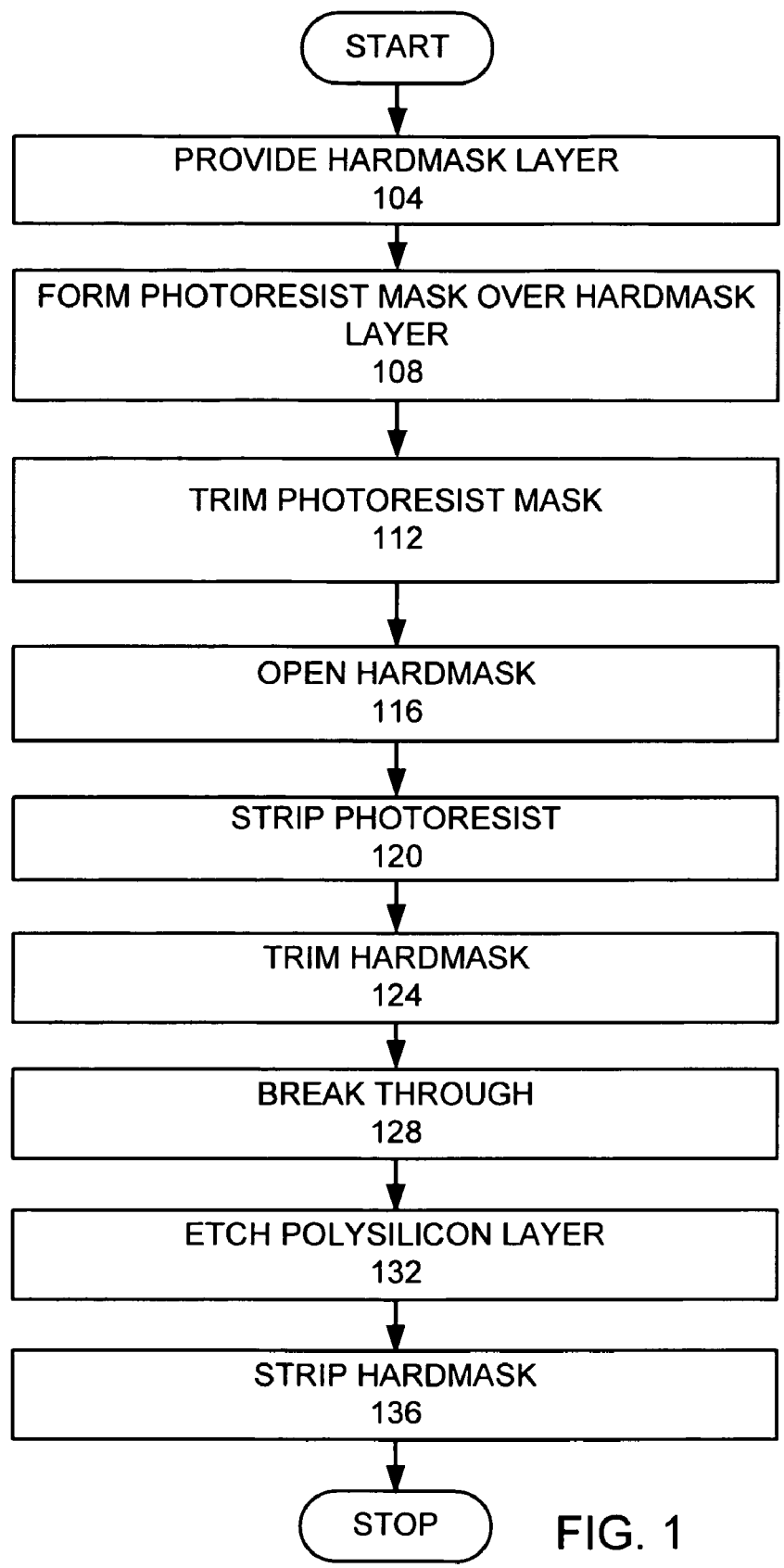
FIG. 1 is a high level flow chart of a process that may be used in an embodiment of the invention.
Figure 2A:
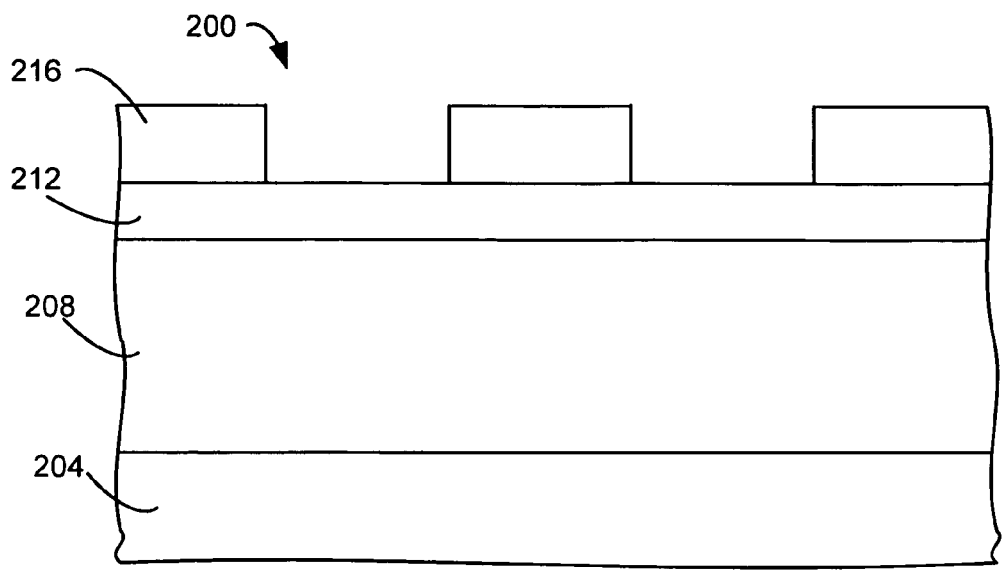
FIGS. 2A-G are schematic cross-sectional views of a stack processed according to an embodiment of the invention.

To facilitate understanding, FIG. 1 is a high level flow chart of a process that may be used in an embodiment of the invention. A hardmask layer is provided over a polysilicon layer (step 104). FIG. 2A is a schematic cross-sectional view of an polysilicon layer 208 over a substrate 204, over which a hardmask layer 212 is formed forming a stack 200.

A patterned photoresist mask 216 is formed over the hardmask layer 212 (step 108). To provide the patterned mask, a photoresist layer may be first formed over the etch layer.

Figure 2B:
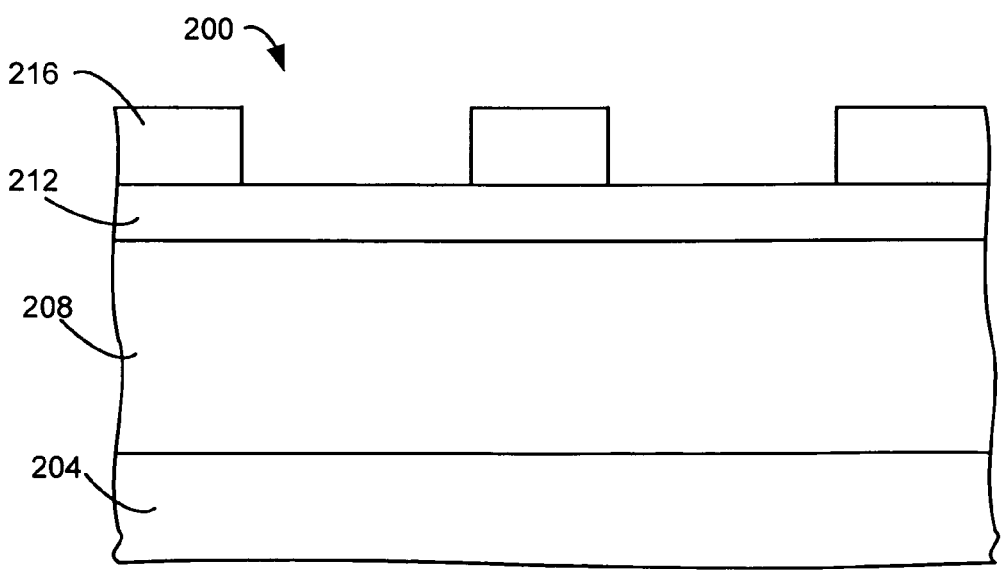

The patterned photoresist mask 216 is trimmed (step 112), as shown in FIG. 2B. The trim is a partial trim in that the trim only partially reduces the mask to a desired CD. A soft BARC layer may be placed between the photoresist and the hardmask, which become the level at which the PR/BARC is trimmed before the hardmask open.

Figure 2C:
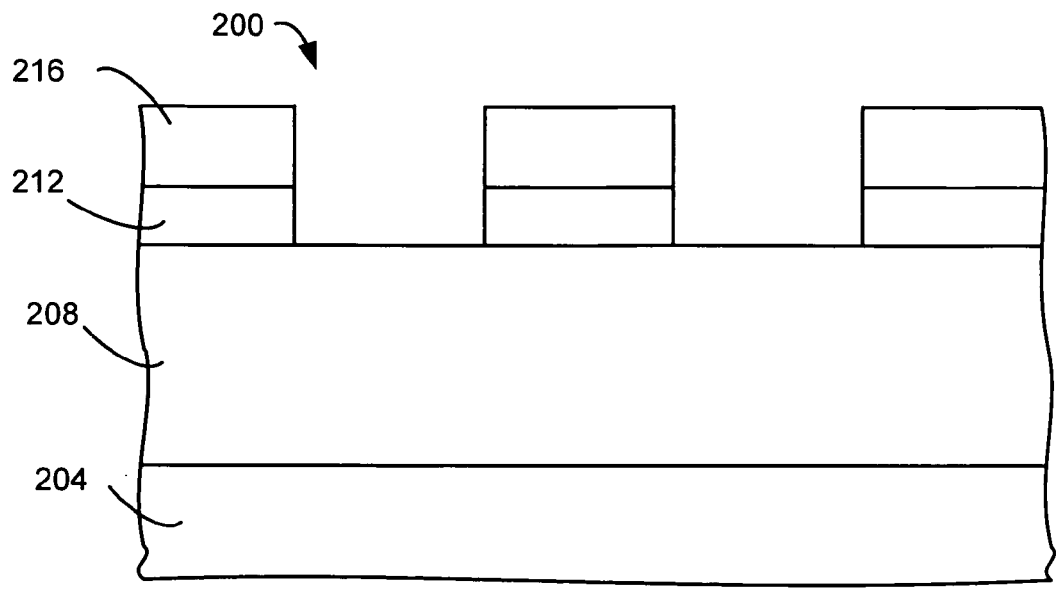
Figure 2D:
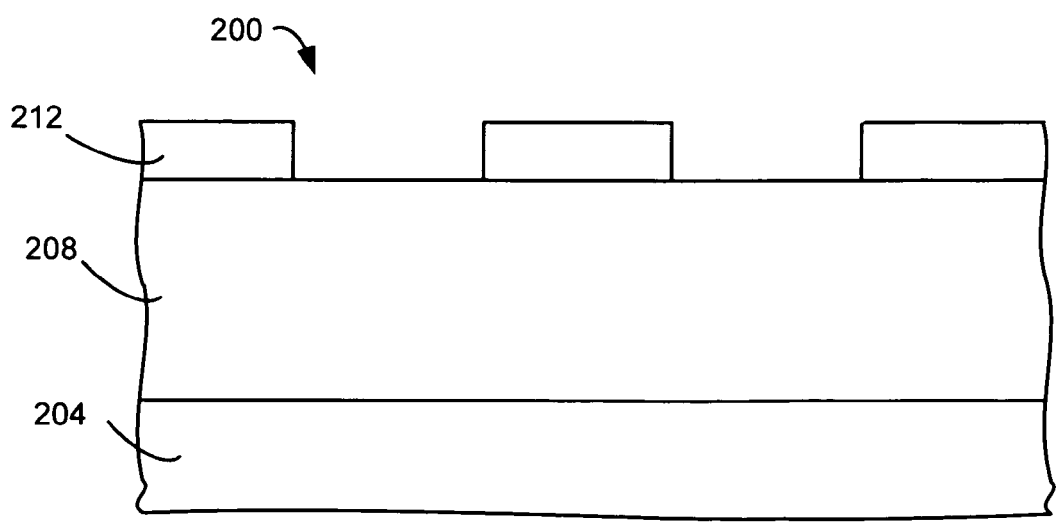

The hardmask layer 212 is opened forming a patterned hardmask (step 116), as shown in FIG. 2C. The photoresist mask 216 is stripped (step 120), as shown in FIG. 2D.

Figure 2E:
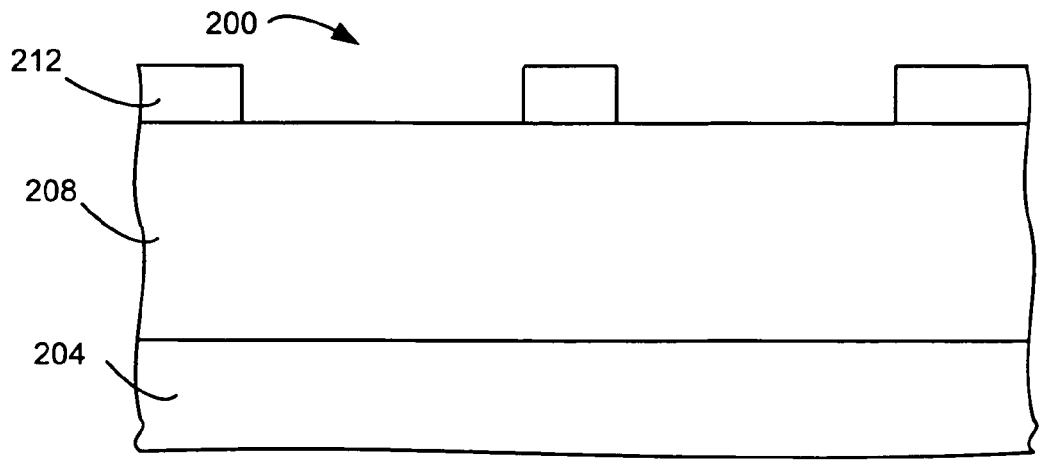

The patterned hardmask formed from the hardmask layer 212 is trimmed (step 124), as shown in FIG. 2E. The hardmask trim provides a hardmask trim gas, which is carbon free and comprises oxygen and a fluorine containing compound. Preferably, the flow rate of oxygen is greater than the flow rate of the fluorine containing compound. The hardmask trim gas is formed into a plasma. The plasma trims the hardmask and preferably provides an infinite selectivity with respect to polysilicon. A break through step (step 128) may be provided to complete the formation of features in the hardmask layers 212. Whether a break through step is needed depends on the chemistry of the subsequent polysilicon etch.

Figure 2F:
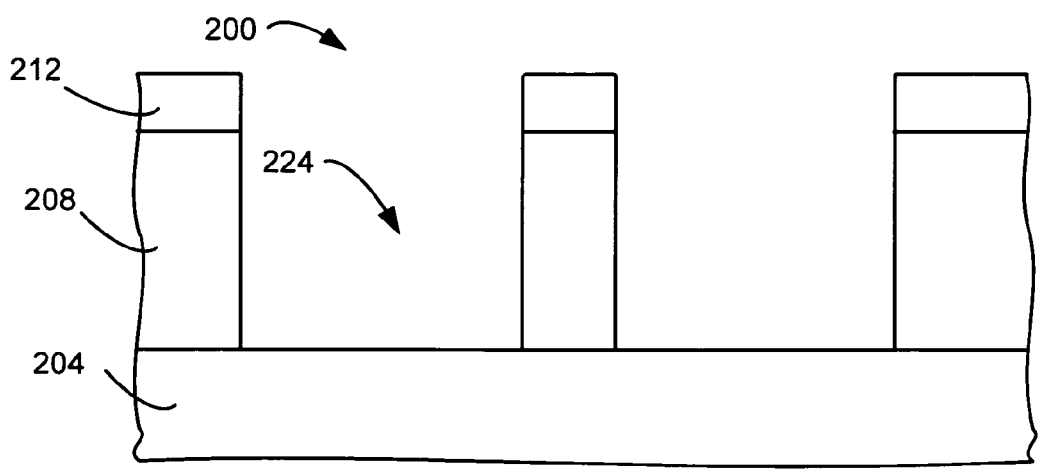
Figure 2G:
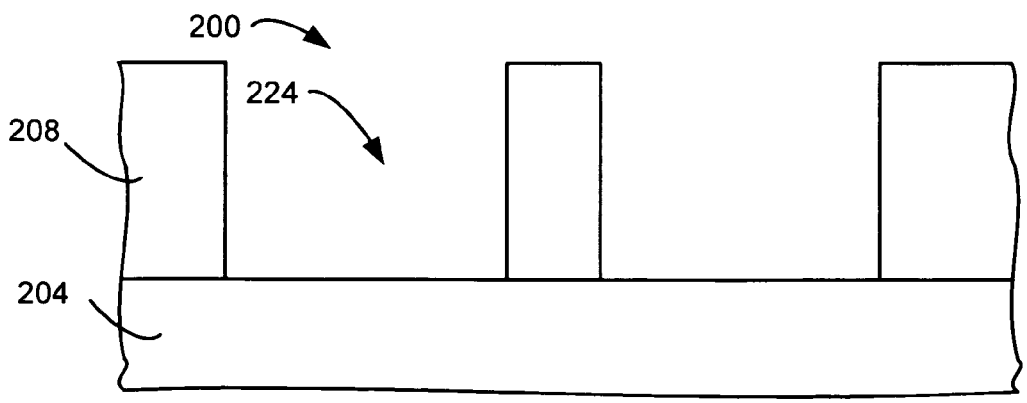

The polysilicon layer 208 is etched through the hardmask (step 132) to form features 224, as shown in FIG. 2F. The hardmask may then be stripped (step 136), as shown in FIG. 2G. Whether a hardmask strip is needed is dependent upon the specific gate application.

EXAMPLE

To provide an example, a hardmask was formed over a polysilicon layer. The hardmask may be a conventional silicon based hardmask material, which preferably is SiN, Silicon Rich Nitride (SRN), $SiO_2$, TEOS, and SiON. More preferably, the hardmask material in this example was a dual SiON/SRN hard mask.

A photoresist mask was formed over the hardmask layer (step 108). In this example, a bottom antireflective coating (BARC) was placed between the photoresist mask and the hardmask layer. In this example, the photoresist was a 193 nm PR.

The photoresist mask was then trimmed (step 112). A conventional photoresist trim, such as by providing a photoresist trim gas of any one or more of $O_2$, HBr, $Cl_2$, He, $CF_4$, etc., which was formed into a plasma, was used.

Figure 3:
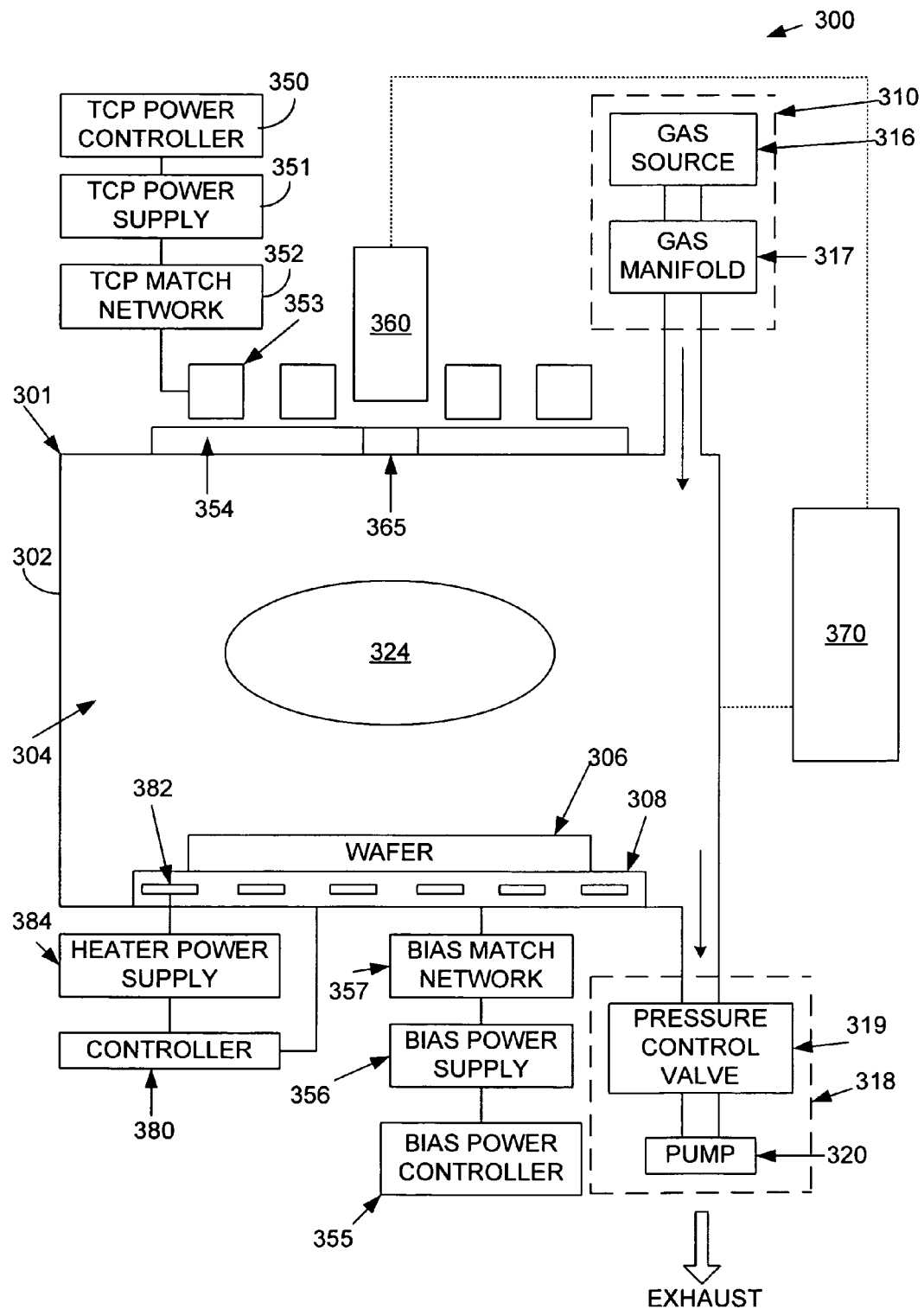
FIG. 3 is a schematic view of a plasma processing chamber that may be used in practicing the invention.

The substrate may then be placed in an etch chamber. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304 while allowing energy to pass from TCP coil 353 to plasma chamber 304. An optically transparent window 365 is provided by a circular piece of sapphire having a diameter of approximately 2.5 cm (1 inch) located in an aperture in the RF transparent window 354.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a substrate 306, such as a semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of heaters 382 provided within the chuck 308 by controlling a heater power supply 384. The plasma processing system 300 also includes electronic control circuitry 370. The plasma processing system 300 may also have an end point detector 360.

Figure 4A:
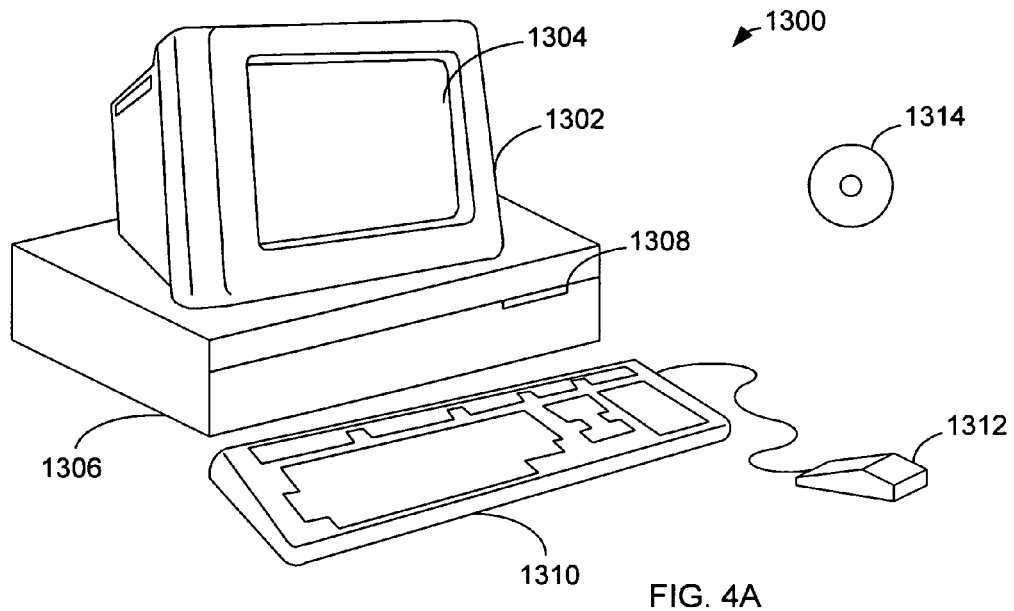
FIGS. 4A-B illustrate a computer system, which is suitable for implementing a controller used in embodiments of the present invention.
Figure 4B:
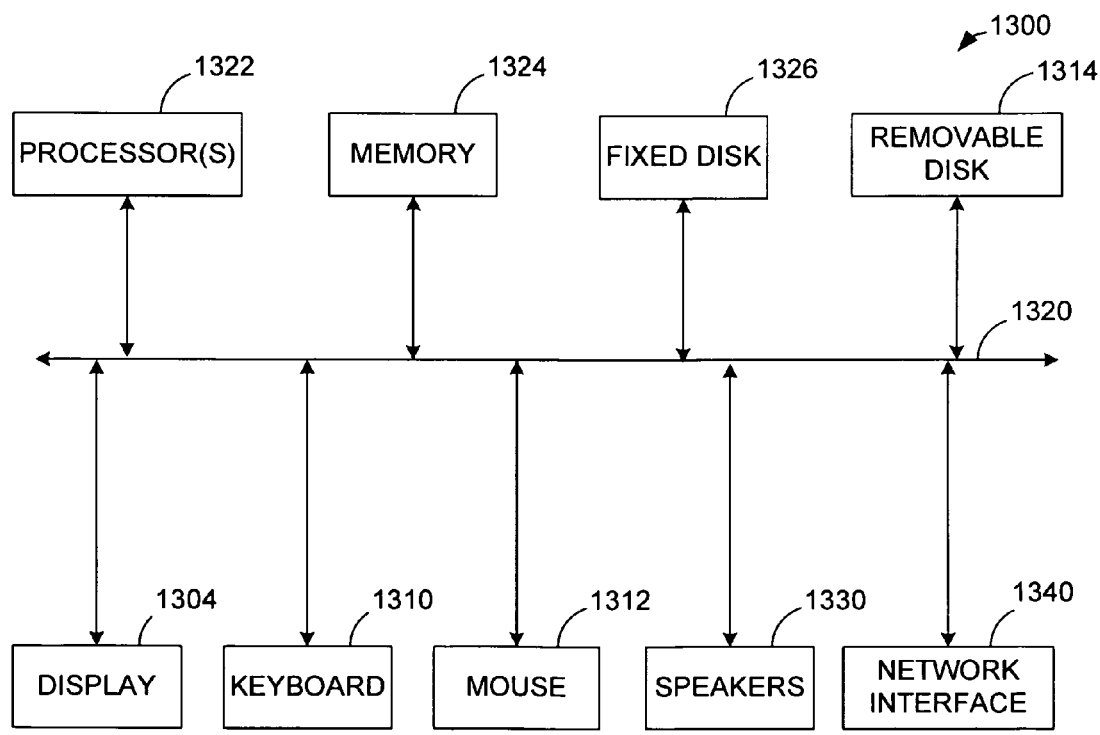

FIGS. 4A and 4B illustrate a computer system 1300, which is suitable for implementing controller for control circuitry 370 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The hardmask layer was then opened (step 116). A conventional hardmask open may be used, which provides a hardmask open gas of one or more of the following; $CF_4$, $CH_2F_2$, $CHF_3$, $SF_6$, $O_2$, Ar, He, $N_2$, etc. Preferably, a fluorine based gas is used as the primary etchant.

The photoresist was stripped (step 120). A conventional ashing using $O_2$ as a stripping gas was used in this example.

The hardmask was trimmed (step 124). The hardmask trim provides a hardmask trim gas, which is carbon free (non-carbon containing) and comprises oxygen and a fluorine containing compound. Preferably, the flow rate of oxygen is greater than the flow rate of the fluorine containing compound. More preferably, the fluorine containing compounds is at least one of $SF_6$ and $NF_3$. More preferably, the flow rate of $O_2$ is greater than the flow rate of $SF_6$ and $NF_3$ by greater than 5 times. More preferably the flow rate of $O_2$ greater than the flow rate of $SF_6$ and $NF_3$ by at least nine times. Preferably, the trim gas is carbon free. In this example, the fluorine component is $SF_6$. The hardmask trim gas is formed into a plasma. The plasma trims the hardmask and preferably provides an infinite selectivity with respect to polysilicon. An example recipe for the hardmask trim provides a pressure of 10 mTorr. 1000 watts are applied through the TCP coil 353. A trim gas of 200 sccm $O_2$ and 15 sccm $SF_6$ is provided.

In this embodiment, a break through etch (step 128) was not used. In other embodiments a conventional break through etch may be used a fluorine based break through gas, such as $CF_4$, may be used.

The polysilicon layer was etched (step 132). A conventional polysilicon etch using a polysilicon etch gas of SF6 and $CH_2F_2$ was provided. Such a polysilicon etch may be performed without a break through step. For HBr based polysilicon etches a break through etch is preferred.

Without being limited by theory, it is believed that the inventive process provides a hardmask trim that uses the oxygen of the trim gas to provide a thin protective SiO layer over the polysilicon. The thin protective layer provides infinite selectivity with respect to polysilicon. As a result, the polysilicon is not damaged or etched during the hardmask trim, which prevents the trim from influencing or shaping the polysilicon profile.

In addition, by trimming the hardmask, less trimming of the photoresist mask is required. The trimming of the photoresist mask also vertically reduces the thickness of the photoresist. Too much trimming of the photoresist mask causes faceting of the photoresist mask to over thinning of the photoresist mask, which causes defects in the features etched into the polysilicon. To further reduce damage that may be caused by the photoresist trim, an embodiment may be provided that does not trim the photoresist.

The absence of carbon in the inventive process also reduces line edge roughness without worsening line edge shortening. It is believed that the presence of carbon forms residues, which increase roughening.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for forming features in a polysilicon layer, comprising:
    forming a hardmask layer over the polysilicon layer;
    forming a photoresist mask over the hardmask layer;
    trimming the photoresist mask;
    etching the hardmask layer through the photoresist mask to form a patterned hardmask after trimming the photoresist mask;
    stripping the photoresist mask before trimming the patterned hardmask;
    trimming the patterned hardmask after stripping the photoresist mask, comprising:
        providing a non-carbon containing trim gas comprising oxygen and a fluorine containing compound;
        forming a plasma from the trim gas; and
        trimming the hardmask; and
    etching features into the polysilicon layer through the hardmask.

2. The method, as recited in claim 1, wherein the trim gas provides an atomic flow rate of oxygen that is greater than an atomic flow rate of fluorine from the fluorine containing compound.

3. The method, as recited in claim 2, wherein the hardmask trim provides an infinite selectivity with respect to polysilicon.

4. The method, as recited in claim 3, further comprising stripping the hardmask after etching features into the polysilicon layer through the hardmask.

5. The method, as recited in claim 1, wherein the fluorine containing compound is $SF_6$, wherein a flow rate of oxygen is greater than five times the flow rate of $SF_6$.

6. The method, as recited in claim 5, wherein the hardmask trim provides an infinite selectivity with respect to polysilicon.

7. The method, as recited in claim 1, wherein the fluorine containing compound is $NF_3$, wherein a flow rate of oxygen is greater than five times the flow rate of $NF_3$.

8. The method, as recited in claim 7, wherein the hardmask trim provides an infinite selectivity with respect to polysilicon.

9. The method, as recited in claim 1, wherein the fluorine containing compound is at least one of $SF_6$ and $NF_3$, wherein a flow rate of oxygen is at least nine times the flow rate of $SF_6$ and $NF_3$.

10. The method, as recited in claim 9, further comprising stripping the hardmask after etching features into the polysilicon layer through the hardmask.

* * * * *